US009596426B2

(12) United States Patent
Handa et al.

(10) Patent No.: US 9,596,426 B2
(45) Date of Patent: Mar. 14, 2017

(54) IMAGING DEVICE, IMAGING SYSTEM, AND METHOD FOR DRIVING IMAGING DEVICE

(71) Applicant: CANON KABUSHIKI KAISHA, Tokyo (JP)

(72) Inventors: Yoichiro Handa, Tokyo (JP); Takanori Watanabe, Yamato (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/854,744

(22) Filed: Sep. 15, 2015

(65) Prior Publication Data
US 2016/0105624 A1 Apr. 14, 2016

(30) Foreign Application Priority Data

Oct. 10, 2014 (JP) ................................ 2014-209293

(51) Int. Cl.
*H04N 5/378* (2011.01)
*H04N 5/232* (2006.01)
*H04N 5/372* (2011.01)
(Continued)

(52) U.S. Cl.
CPC ....... *H04N 5/378* (2013.01); *H01L 27/14603* (2013.01); *H01L 27/14641* (2013.01); *H04N 5/347* (2013.01); *H04N 5/372* (2013.01); *H04N 5/37213* (2013.01); *H04N 5/37457* (2013.01); *H04N 5/23212* (2013.01)

(58) Field of Classification Search
CPC .... H04N 5/372; H04N 5/37213; H04N 5/232; H04N 5/23212; H04N 5/378; H04N 5/374; H04N 5/37457; H01L 27/14603; H01L 27/14641
See application file for complete search history.

(56) References Cited

U.S. PATENT DOCUMENTS 6,731,337 B2   5/2004  Watanabe
7,456,880 B2  11/2008  Okita et al.
(Continued)

FOREIGN PATENT DOCUMENTS

JP       2013-106194 A      5/2013

OTHER PUBLICATIONS

U.S. Appl. No. 14/818,756, Satoko Iida, filed Aug. 5, 2015.

*Primary Examiner* — Abdelaaziz Tissire
(74) *Attorney, Agent, or Firm* — Fitzpatrick, Cella, Harper & Scinto

(57) ABSTRACT

An imaging device includes first and second photoelectric conversion portions, a charge holding portion, first and second transfer transistors, and an amplifier portion, wherein in a first control operation, from a state in which the first and the second transfer transistors are off, the first transfer transistor is turned on while the second transfer transistor remains off, in a second control operation, the first and the second transfer transistors are being on, and a difference between a control voltage provided in the first control operation to the first transfer transistor to turn on and a control voltage provided to the first transfer transistor to turn off is smaller than difference between a control voltage provided in the second control operation to the first transfer transistor to turn on and the control voltage provided to the first transistor to turn off.

11 Claims, 8 Drawing Sheets

(51) Int. Cl.
*H04N 5/347* (2011.01)
*H04N 5/3745* (2011.01)
*H01L 27/146* (2006.01)

(56) References Cited

U.S. PATENT DOCUMENTS

| | | | |
|---|---|---|---|
| 7,514,732 B2 | 4/2009 | Okita et al. | |
| 7,911,521 B2 | 3/2011 | Kuroda et al. | |
| 7,920,192 B2 | 4/2011 | Watanabe et al. | |
| 7,935,995 B2 | 5/2011 | Watanabe et al. | |
| 7,982,789 B2 | 7/2011 | Watanabe et al. | |
| 8,110,885 B2 | 2/2012 | Iida et al. | |
| 8,115,847 B2 | 2/2012 | Watanabe | |
| 8,466,532 B2 | 6/2013 | Watanabe | |
| 8,570,418 B2 | 10/2013 | Watanabe | |
| 8,730,345 B2 | 5/2014 | Watanabe | |
| 8,779,544 B2 | 7/2014 | Yamashita et al. | |
| 9,123,621 B2 | 9/2015 | Watanabe | |
| 2005/0083421 A1* | 4/2005 | Berezin | H04N 3/155 348/308 |
| 2006/0138489 A1* | 6/2006 | Ahn | H01L 27/14603 257/292 |
| 2006/0261431 A1* | 11/2006 | Kim | H01L 27/14609 257/462 |
| 2007/0252182 A1* | 11/2007 | Beck | H01L 27/14609 257/292 |
| 2008/0012973 A1* | 1/2008 | Park | H04N 5/335 348/294 |
| 2008/0084489 A1* | 4/2008 | Kishi | H04N 5/37457 348/308 |
| 2009/0322921 A1* | 12/2009 | Ishimoto | H04N 5/3559 348/301 |
| 2010/0097508 A1* | 4/2010 | Yanagita | H01L 27/14603 348/301 |
| 2010/0214464 A1 | 8/2010 | Watanabe | |
| 2011/0316839 A1* | 12/2011 | Minowa | H01L 27/14609 345/211 |
| 2013/0120624 A1* | 5/2013 | Okita | H04N 5/335 348/300 |
| 2014/0253771 A1 | 9/2014 | Okita et al. | 348/300 |
| 2014/0320690 A1* | 10/2014 | Kobayashi | H01L 27/14609 348/222.1 |
| 2015/0172579 A1* | 6/2015 | Manabe | H04N 5/378 250/208.1 |
| 2015/0244959 A1 | 8/2015 | Araoka et al. | |
| 2015/0281610 A1* | 10/2015 | Ota | H04N 5/3745 250/208.1 |
| 2015/0341584 A1* | 11/2015 | Handa | H04N 5/3698 348/298 |

\* cited by examiner

IMAGING DEVICE, IMAGING SYSTEM, AND METHOD FOR DRIVING IMAGING DEVICE

BACKGROUND OF THE INVENTION

Field of the Invention

The present invention relates to an imaging device, an imaging system, and a method for driving the imaging device.

Description of the Related Art

An imaging device is proposed which is configured so as to be capable of performing both of focus detection and imaging. According to Japanese Patent Application Laid-Open No. 2013-106194, one pixel of the imaging device includes a first photoelectric conversion portion and a second photoelectric conversion portion. Each of the photoelectric conversion portions is arranged so as to be approximately conjugated with a pupil of a lens. At the time of the focus detection, signals are independently read out from each of the first photoelectric conversion portions and the second photoelectric conversion portions in a plurality of pixels, and two images are generated by luminous fluxes which have passed through mutually different positions in the pupil of the lens. In addition, an image of an object can be obtained (imaged) by an operation of adding the signals of the two photoelectric conversion portions.

In Japanese Patent Application Laid-Open No. 2013-106194, an imaging device is also disclosed which is configured to have one common amplifier for the first photoelectric conversion portion and the second photoelectric conversion portion. It is disclosed that the above imaging device outputs a signal which corresponds to an electric charge of the first photoelectric conversion portion and a signal which corresponds to the sum of the electric charges of the first and the second photoelectric conversion portions.

SUMMARY OF THE INVENTION

According to one exemplary embodiment of the present invention, there is provided an imaging device including a first photoelectric conversion portion which converts light into an electric charge, a second photoelectric conversion portion which converts light into an electric charge, a charge holding portion which holds an electric charge, a first transfer transistor which transfers an electric charge of the first photoelectric conversion portion to the charge holding portion, a second transfer transistor which transfers an electric charge of the second photoelectric conversion portion to the charge holding portion, and an amplifier portion which outputs a signal based on an electric charge of the charge holding portion, wherein in a first control operation, from a state in which both of the first transfer transistor and the second transfer transistor are off, the first transfer transistor is turned on while the second transfer transistor remains off, in a second control operation, both of the first transfer transistor and the second transfer transistor are being on, and a difference between a control voltage provided in the first control operation to the first transfer transistor to turn on the first transfer transistor and a control voltage provided to the first transfer transistor to turn off the first transfer transistor is smaller than a difference between a control voltage provided in the second control operation to the first transfer transistor to turn on the first transfer transistor and the control voltage provided to the first transfer transistor to turn off the first transfer transistor.

According to another exemplary embodiment of the present invention, there is provided an imaging device including a first photoelectric conversion portion which converts light into an electric charge, a second photoelectric conversion portion which converts light into an electric charge, a first charge holding portion which holds an electric charge, a second charge holding portion which holds an electric charge, a first transfer transistor which transfers an electric charge of the first photoelectric conversion portion to the first charge holding portion, a second transfer transistor which transfers an electric charge of the second photoelectric conversion portion to the second charge holding portion, a first amplifier portion which outputs a signal based on an electric charge of the first charge holding portion, a second amplifier portion which outputs a signal based on an electric charge of the second charge holding portion, and an addition transistor for electrically connecting the first charge holding portion and the second charge holding portion, wherein in a state in which the addition transistor is turned on, both of the first transfer transistor and the second transfer transistor are being on, a difference between a control voltage provided, in a state in which the addition transistor is being off, to the first transfer transistor to turn on the first transfer transistor and a control voltage provided to the first transfer transistor to turn off the first transfer transistor is smaller than a difference between a control voltage provided, in a state in which the addition transistor is being on, to the first transfer transistor to turn on the first transfer transistor and the control voltage provided to the first transfer transistor to turn off the first transfer transistor, and is smaller than a difference between a control voltage provided, in a state in which the addition transistor is being on, to the second transfer transistor to turn on the second transfer transistor and a control voltage provided to the second transfer transistor to turn on the second transfer transistor, and a difference between a control voltage provided, in a state in which the addition transistor is turned off, to the second transfer transistor to turn on the second transfer transistor and a control voltage provided to the second transfer transistor to turn off the second transfer transistor is smaller than the difference between the control voltage provided, in a state in which the addition transistor is being on, to the first transistor to turn on the first transfer transistor and the control voltage provided to the first transfer transistor to turn off the first transfer transistor, and is smaller than the difference between the control voltage provided, in a state in which the addition transistor is being on, to the second transfer transistor to turn on the second transfer transistor and the control voltage provided to the second transfer transistor to turn off the second transfer transistor.

Further features of the present invention will become apparent from the following description of exemplary embodiments with reference to the attached drawings.

DESCRIPTION OF THE EMBODIMENTS

Preferred embodiments of the present invention will now be described in detail in accordance with the accompanying drawings.

Imaging devices according to some exemplary embodiments can reduce a noise. When the signal is read out which corresponds to an electric charge of a first photoelectric conversion portion, only one of two transfer transistors is turned on. At this time, because an amount of change of a potential in a floating diffusion portion is small, there is a possibility that an electric charge remains in a channel of the transfer transistor. The electric charge in the channel of the transfer transistor often returns to the first photoelectric conversion portion, and there is a possibility that a noise is generated. With respect to such a problem, an object of some exemplary embodiments is to reduce the noise.

First Embodiment

Figure 1:
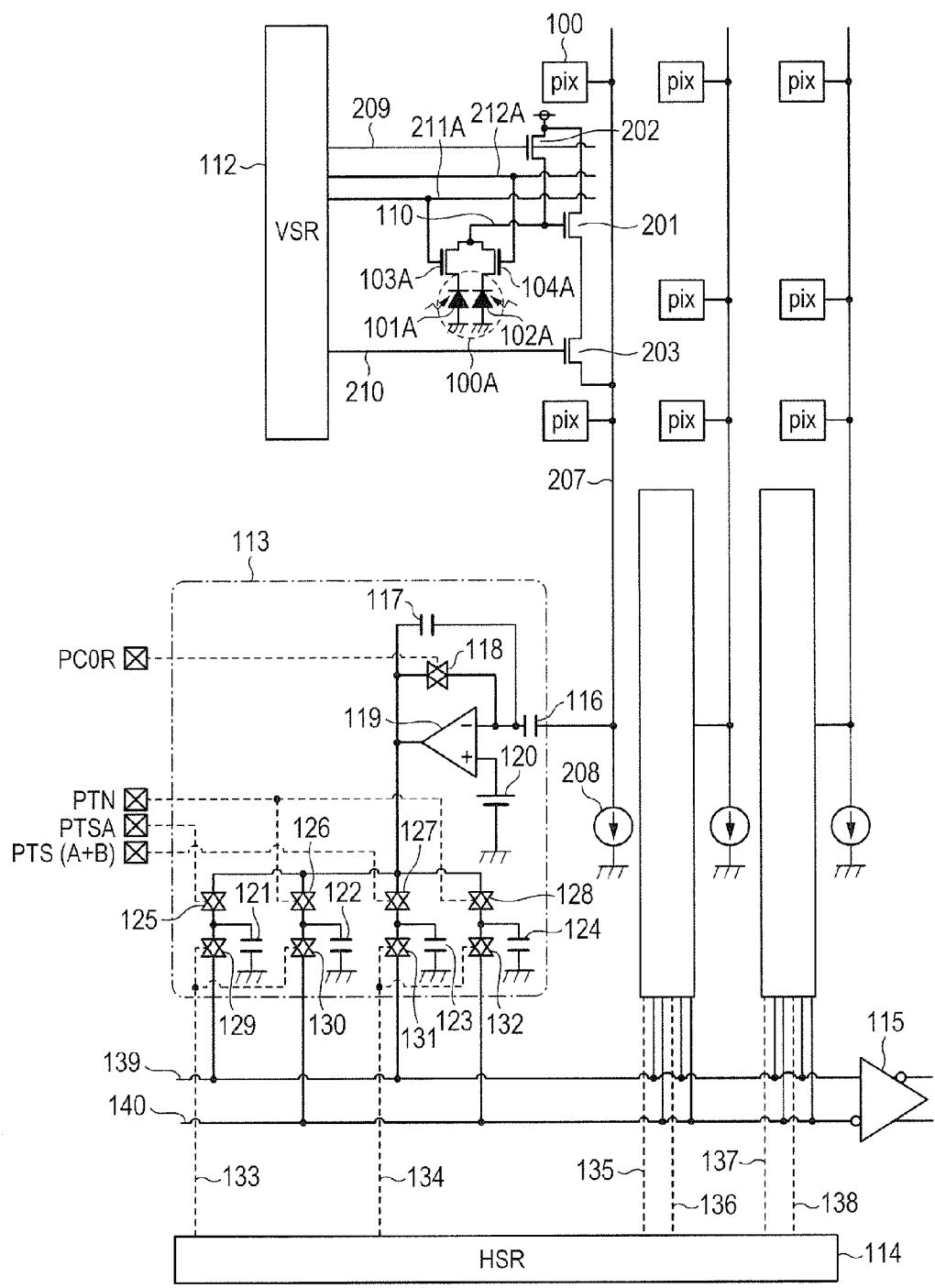
FIG. 1 is a view illustrating an equivalent circuit of an imaging device.

FIG. 1 is a view illustrating a configuration example of an imaging device according to a first embodiment of the present invention. The imaging device has a plurality of pixel units 100 which are arranged in a two-dimensional matrix form. Each of the plurality of pixel units 100 has a pixel 100A, transfer transistors 103A and 104A, an amplifier portion 201, a reset transistor 202 and a select transistor 203. The pixel 100A has a first photoelectric conversion portion 101A and a second photoelectric conversion portion 102A. The photoelectric conversion portions 101A and 102A are, for instance, photo diodes, and convert light into an electric charge. The transfer transistor 103A transfers the electric charge of the photoelectric conversion portion 101A to a floating diffusion portion (FD portion) 110. The transfer transistor 104A transfers the electric charge of the photoelectric conversion portion 102A to the FD portion 110. The FD portion 110 is electrically connected to an input node of the amplifier portion 201, and holds the electric charge. The charge holding portion contains the FD portion 110, and holds an electric charge. The amplifier portion 201 outputs a signal based on the electric charge of the FD portion 110 to an output signal line 207. An MOS transistor can be used for the amplifier portion 201. A reset transistor 202 supplies a reset voltage to an input node of the amplifier portion 201. The select transistor 203 controls electrical connection between the amplifier portion 201 and the output signal line 207. A current source 208 is electrically connected to the output signal line 207. The current source 208 supplies a bias current to the amplifier portion 201, and the amplifier portion 201 and the current source 208 constitute a source follower. Each of a plurality of output signal lines 207 is connected to each column of the plurality of pixel units 100, in common.

A driving signal line 211A, a driving signal line 212A, a driving signal line 209 and a driving signal line 210 are connected to gates of the first transfer transistor 103A, the second transfer transistor 104A, the reset transistor 202 and the select transistor 203, respectively. A driving pulse output from a vertical scanning circuit 112 is supplied to the respective gates of the transistors sequentially or randomly row by row. The vertical scanning circuit 112 is a control unit.

Signals output from the plurality of output signal lines 207 are input to a plurality of column circuits 113, respectively. The column circuit 113 may be connected to the output signal line 207 directly or through a switch. The signals which have been processed in the column circuit 113 are sequentially output to an output amplifier 115 by a horizontal scanning circuit 114, and are output to the outside.

A main operation of the column circuit 113 is to inversely amplify the signal output from the output signal line 207 with a gain which is determined by a capacitance value of an input capacitor 116 and a capacitance value of a feedback capacitor 117. The column circuit 113 can also perform a virtual short operation, and can perform a CDS (correlation double sampling) operation by a clamping operation using the input capacitor 116.

Next, one example of a specific circuit of the column circuit 113 will be described. A first node of the input capacitor 116 is electrically connected to the output signal line 207, and a second node of the input capacitor 116 is electrically connected to an inverting input node of an operational amplifier 119. A first node of the feedback capacitor 117 is electrically connected to the inverting input node of the operational amplifier 119, and the second node of the input capacitor 116. A second node of the feedback capacitor 117 is electrically connected to an output node of the operational amplifier 119. A switch 118 is provided in a feedback path between the inverting input node and the output node of the operational amplifier 119, in order to control electrical connection between both of the nodes. The feedback capacitor 117 and the switch 118 are provided in parallel.

A power source 120 supplies a reference voltage Vref to a non-inverting input node of the operational amplifier 119. Holding capacitors 121 to 124 are capacitors for holding a signal output from the operational amplifier 119. Switches 125 to 128 are provided in electrical paths between the holding capacitors 121 to 124 and the operational amplifier 119, and control electrical connections between the output node of the operational amplifier 119 and the holding capacitors 121 to 124, respectively. Switches 129 to 132 output signals which are held in the holding capacitors 121 to 124 to a horizontal output signal line 139 or 140, according to a signal output from the horizontal scanning circuit 114. The output amplifier 115 outputs a difference between the signals which have been output to the horizontal output signal lines 139 and 140, to the outside.

A driving pulse PC0R is supplied to the switch 118. A driving pulse PTN is supplied to the switches 126 and 128. A driving pulse PTSA is supplied to the switch 125. A driving pulse PTS(A+B) is supplied to the switch 127.

Figure 2:
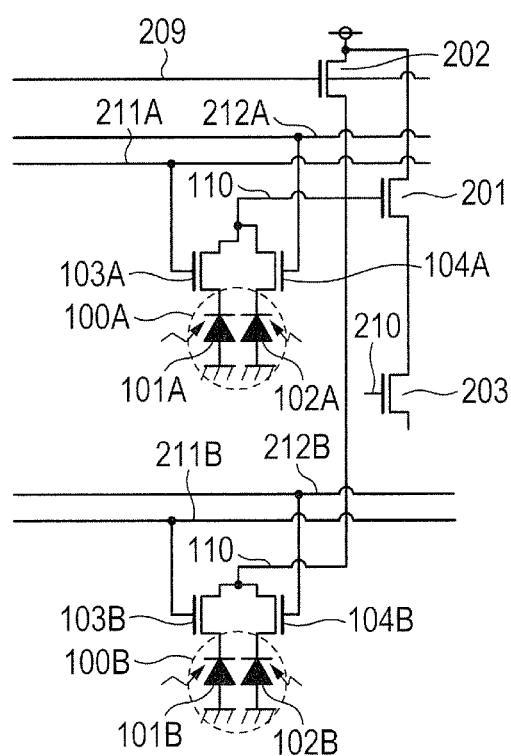
FIG. 2 is a view illustrating an equivalent circuit of the imaging device.

FIG. 2 is a view illustrating another configuration example of the pixel portion 100 in the imaging device of FIG. 1. The pixel portion 100 in FIG. 2 is a pixel portion in which a pixel 100B and transfer transistors 103B and 104B are added to the pixel portion 100 of FIG. 1. Each of the plurality of pixel portions 100 has the amplifier portion 201. A plurality of pixels 100A and 100B share one amplifier portion 201. In FIG. 2, portions having similar functions to those in FIG. 1 are designated by the same reference numeral. Different alphabets are attached subsequently to the reference numerals, and thereby corresponding elements are illustrated.

The pixel portion 100 in FIG. 2 has the first pixel 100A which includes the first photoelectric conversion portion 101A and the second photoelectric conversion portion 102A, and the second pixel 100B which includes a first photoelectric conversion portion 101B and a second photoelectric conversion portion 102B. Light which has been condensed by a first microlens is incident on the plurality of photoelectric conversion portions 101A and 102A which are included in the first pixel 100A. Light which has been condensed by a second microlens is incident on the plurality of photoelectric conversion portions 101B and 102B which are included in the second pixel 100B.

The transfer transistor 103A is connected between the photoelectric conversion portion 101A and the FD portion 110. The transfer transistor 104A is connected between the photoelectric conversion portion 102A and the FD portion 110. The transfer transistor 103B is connected between the photoelectric conversion portion 101B and the FD portion 110. The transfer transistor 104B is connected between the photoelectric conversion portion 102B and the FD portion 110. The driving signal lines 211A and 212A and driving signal lines 211B and 212B are arranged as interconnections which supply driving pulses to the transfer transistors 103A, 104A, 103B and 104B, respectively.

According to such a configuration, the plurality of pixels 100A and 100B for imaging can share the amplifier portion 201, the reset transistor 202 and the select transistor 203. Thereby, the number of the transistors per one pixel can be reduced. As a result, the area of the photoelectric conversion portion can be expanded.

Figure 3:
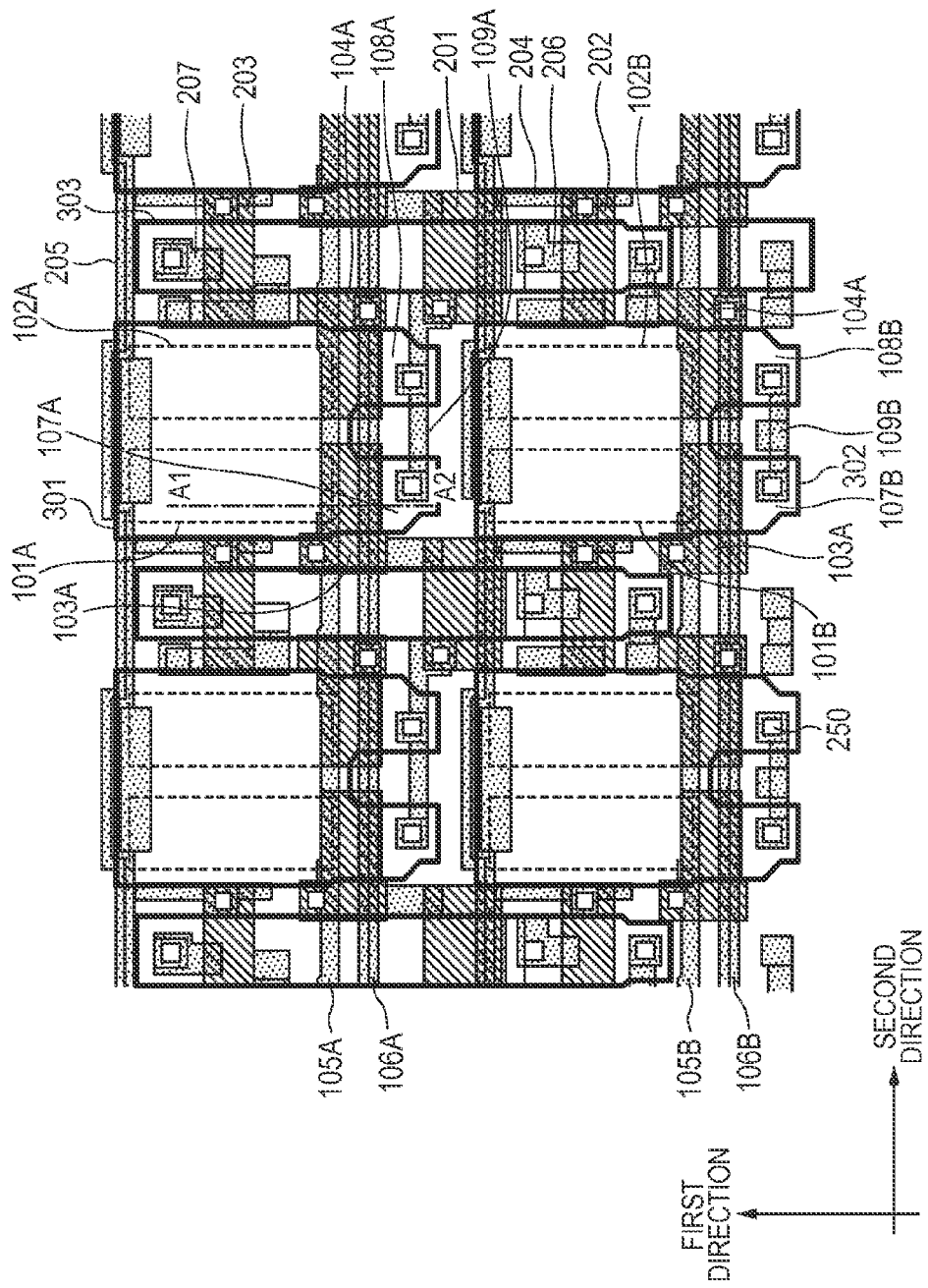
FIG. 3 is a view schematically illustrating a planar structure of the imaging device.

Next, a planar structure of the imaging device according to the present embodiment will be described. FIG. 3 is a view schematically illustrating the planar structure of the imaging device illustrated in FIG. 2. In FIG. 3, portions corresponding to the elements illustrated in FIG. 2 are designated by the same reference numerals as those in FIG. 2.

The imaging device is formed on a semiconductor substrate such as a silicon substrate, for instance. The semiconductor substrate includes a plurality of active regions. The two photoelectric conversion portions 101A and 102A which are included in the first pixel 100A are arranged in a first active region 301. The two photoelectric conversion portions 101B and 102B which are included in the second pixel 100B are arranged in a second active region 302 which is different from the first active region 301. The first photoelectric conversion portion 101A includes an N-type first semiconductor region which accumulates a signal charge. The second photoelectric conversion portion 102A includes an N-type second semiconductor region which accumulates a signal charge. The area of the first semiconductor region and the area of the second semiconductor region can be equal to each other when viewed as a plane, but the relationship is not limited in particular.

The first photoelectric conversion portion 101A and the second photoelectric conversion portion 102A are arranged so as to be approximately conjugated with a pupil of the lens. The two photoelectric conversion portions 101A and 102A receive luminous fluxes which have passed through mutually different positions of the pupil of the lens, respectively. This configuration enables focus detection. Incidentally, the imaging device for the focus detection is one of the plurality of embodiments. In another embodiment of the present invention, an operation of reading out respective signals and an added signal from the two photoelectric conversion portions may be performed for another application.

In the first active region 301, a first floating diffusion region (FD region) 107A which holds an electric charge and a second FD region 108A which holds an electric charge are arranged. The electric charge of the first photoelectric conversion portion 101A is transferred to the first FD region 107A. The electric charge of the second photoelectric conversion portion 102A is transferred to the second FD region 108A. The two FD regions 107A and 108A are electrically connected to each other by a contact plug and an electroconductive member 109A. The first FD region 107A, the second FD region 108A and the electroconductive member 109A constitute the FD portion 110. Incidentally, a figure which is designated by a reference numeral 250 denotes the contact plug. All the similar figures are contact plugs. However, the reference numerals of the other contact plugs are omitted for simplification of the drawing.

In FIG. 3, gate electrodes of each of the transistors are designated by the same reference numerals as those for corresponding elements illustrated in FIG. 2. For instance, the gate electrode shown by reference numeral 103A constitutes the gate of the first transfer transistor 103A in FIG. 2. Other gate electrodes are also similar to the above case.

As is illustrated in FIG. 3, the gate electrode of the first transfer transistor 103A is arranged between the first photoelectric conversion portion 101A and the FD region 107A in a plan view. The gate electrode of the second transfer transistor 104A is arranged between the second photoelectric conversion portion 102A and the FD region 108A in a plan view.

An amplifier transistor which is used for the amplifier portion 201, the reset transistor 202, and the select transistor 203 are arranged in a third active region 303 which is different from the active regions 301 and 302 in which the photoelectric conversion portions are arranged. These transistors share a source region or a drain region with other transistor. The drain region which is shared by the amplifier transistor that is used for the amplifier portion 201 and by the reset transistor 202 is electrically connected to the electroconductive member 206 that supplies a power source voltage, through the contact plug. The source region of the select transistor 203 is electrically connected to the electroconductive member which constitutes the output signal line 207, through the contact plug.

The FD portion 110 is electrically connected to a gate electrode of the amplifier transistor which is used for the amplifier portion 201, through the contact plug. Specifically, the electroconductive member 109A which electrically connects the two FD regions 107A and 108A to each other is electrically connected to the gate electrode of the amplifier transistor that is used for the amplifier portion 201, through the contact plug. Incidentally, the FD regions 107B and 108B which correspond to the second pixel 100B are also electrically connected to the gate electrode of the amplifier transistor which is used for the amplifier portion 201, through an unillustrated electroconductive member and a contact plug.

The gate electrode of the first transfer transistor 103A is electrically connected to an electroconductive member 105A which corresponds to the driving signal line 211A in FIG. 2, through the contact plug. The gate electrode of the second transfer transistor 104A is electrically connected to an electroconductive member 106A which corresponds to the driving signal line 212A in FIG. 2, through the contact plug. The gate electrode of the reset transistor 202 is electrically connected to an electroconductive member 204 which corresponds to the driving signal line 209 in FIG. 2, through a contact plug. The gate electrode of the select transistor 203 is electrically connected to an electroconductive member 205 which corresponds to the driving signal line 210 in FIG. 2, through a contact plug.

In the present embodiment, the electroconductive members 105A, 106A, 109A, 105B, 106B, 109B, 204 and 205 are arranged in an interconnection layer of the same level. Of course, any one of these electroconductive members may be arranged in an interconnection layer of another level. Electroconductive members which include the output signal line 207, a power source line, a ground line, an interconnection for light-shielding and the like are included in an interconnection layer which is not illustrated in FIG. 3.

As is illustrated in FIG. 3, at least a part of an orthogonal projection of the second electroconductive member 106A onto a predetermined plane is positioned between an orthogonal projection of the first electroconductive member 105A onto the predetermined plane and an orthogonal projection of the first FD region 107A or the second FD region 108A onto the predetermined plane, any of which is contained in the FD portion 110. The predetermined plane is, for instance, a plane which is parallel to an interface between a semiconductor substrate and an insulating film which is arranged above the semiconductor substrate.

Incidentally, in a modified example, at least a part of the orthogonal projection of the first electroconductive member 105A onto the predetermined plane is positioned between the orthogonal projection of the second electroconductive member 106A onto the predetermined plane and the orthogonal projection of the FD region 107A or 108A onto the predetermined plane, any of which is contained in the FD portion 110. In other words, in FIG. 3, the position of the first electroconductive member 105A and the position of the second electroconductive member 106A are exchanged.

Due to such a structure, a capacitive component existing between the first electroconductive member 105A and the FD portion 110 is smaller than the capacitive component existing between the second electroconductive member 106A and the FD portion 110. Specifically, in this case, the capacitive component existing between the first electroconductive member 105A and the FD portion 110 is approximately a half of the capacitive component existing between the second electroconductive member 106A and the FD portion 110. The total of the capacitive components existing between the FD portion 110 and the first electroconductive member 105A and between the FD portion 110 and the second electroconductive member 106A is approximately 20% of the total capacitance of the FD portion 110. Incidentally, the above described numeric values are just one example, and may be approximately changed.

In the present embodiment, the first photoelectric conversion portion 101A, the gate electrode of the first transfer transistor 103A and the first FD region 107A are aligned in a channel direction (first direction in FIG. 3) of the first transfer transistor 103A. The second photoelectric conversion portion 102A, the gate electrode of the second transfer transistor 104A and the second FD region 108A are aligned in a channel direction of the second transfer transistor 104A. On the other hand, each of the first electroconductive member 105A and the second electroconductive member 106A extends in a direction which intersects each of these channel directions (second direction in FIG. 3). Due to such an arrangement, the driving signal lines of the transfer transistors can be efficiently arranged, and accordingly the opening on the photoelectric conversion portions can be increased. As a result, according to the present embodiment, the sensitivity can be enhanced.

In addition, in the present embodiment, the orthogonal projection of the gate electrode of the first transfer transistor 103A onto the predetermined plane at least partially overlaps each of the orthogonal projections of the first electroconductive member 105A and the second electroconductive member 106A onto the predetermined plane. The orthogonal projection of the gate electrode of the second transfer transistor 104A onto the predetermined plane at least partially overlaps each of the orthogonal projections of the first electroconductive member 105A and the second electroconductive member 106A onto the predetermined plane. Due to such an arrangement, the driving signal lines of the transfer transistors can be efficiently arranged, and accordingly the opening on the photoelectric conversion portions can be increased. As a result, according to the present embodiment, the sensitivity can be enhanced.

Figure 4:
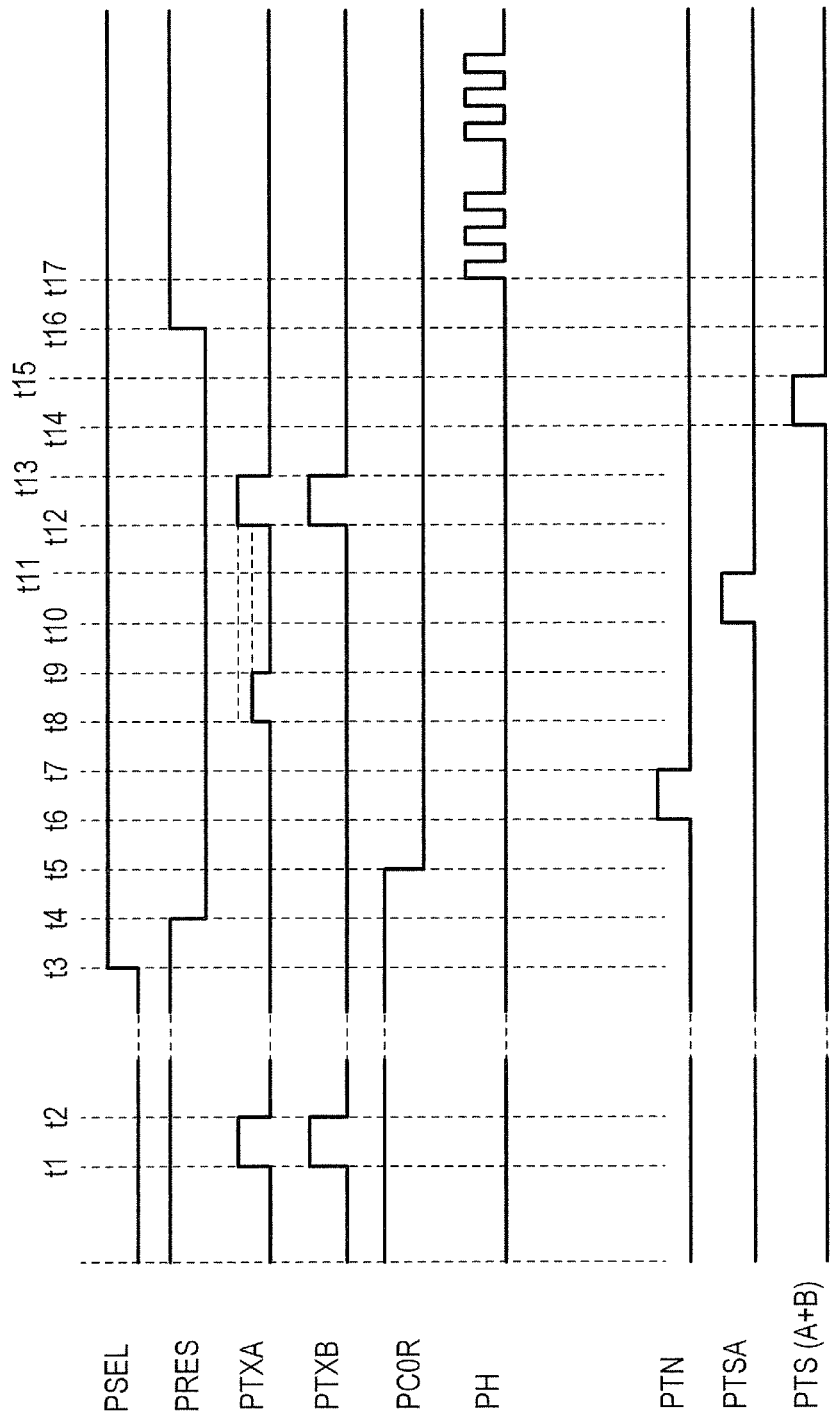
FIG. 4 is a view illustrating a driving timing of the imaging device.

FIG. 4 is a timing chart illustrating a method for driving the imaging device according to the present embodiment. Here, an operation of the imaging device illustrated in FIG. 1 will be described below. As for any of the driving pulses, the transistor corresponding to a time period of a high level is turned on, and the transistor corresponding to a time period of a low level is turned off.

Firstly, at the time t1, a driving pulse PTXA which is supplied to a driving signal line 211A and a driving pulse PTXB which is supplied to a driving signal line 212A become high levels, and the transfer transistors 103A and 104A are turned on. At this time, the driving pulse PRES which is supplied to a driving signal line 209 is in a high level, and accordingly the reset transistor 202 is turned on and the first photoelectric conversion portion 101A, the second photoelectric conversion portion 102A and the FD portion 110 are reset.

Next, at the time t2, the driving pulses PTXA and PTXB become low levels, and the transfer transistors 103A and 104A are turned off. At this timing, charge accumulation periods in the first photoelectric conversion portion 101A and the second photoelectric conversion portion 102A are started. Because the driving pulse PRES keeps the high level, a reset operation of the FD portion 110 is continued which is an input node of the amplifier portion 201.

Next, at the time t3, a driving pulse PSEL which is supplied to the driving signal line 210 of the select transistor 203 becomes a high level, and the select transistor 203 is turned on. Thereby, the signal which corresponds to a voltage of the FD portion 110, specifically, to the voltage of the input node of the amplifier portion 201 is output to the output signal line 207.

Next, at the time t4, the driving pulse PRES which is supplied to the driving signal line 209 of the reset transistor 202 becomes a low level and the reset transistor 202 is turned off, and a reset operation of the input node of the amplifier portion 201 is released. At this time, the amplifier portion 201 outputs a signal (reset level signal) based on a state in which the FD portion 110 is reset, to the output signal line 207. The reset level signal which has been output to the output signal line 207 is input to the column circuit 113. At this time, in the column circuit 113, the operational amplifier 119 is in a virtual short state. Specifically, a driving pulse PC0R is in a high level, and a switch 118 is in a turned-on state. The operational amplifier 119 is in a state of buffering the output of a reference voltage Vref, and the reset level signal is supplied to the input capacitor 116 in this state.

Next, at the time t5, the driving pulse PC0R becomes a low level, and the switch 118 is turned off. Next, at the time t6, a driving pulse PTN becomes a high level from a low level, and the switches 126 and 128 are turned on. Next, at the time t7, a driving pulse PTN becomes the low level from the high level, and the switches 126 and 128 are turned off. By this operation, a voltage of approximately Vref which is an output of the operational amplifier 119 is held as the reset level signal, by the holding capacitors 122 and 124. Next, at the time t8, the driving pulse PTXA becomes a high level and at the time t9, the driving pulse PTXA becomes a low level. By this operation, the transfer transistor 103A is turned on, and the electric charge of the photoelectric conversion portion 101A is transferred to the FD portion 110. Thereby, the first signal based on the electric charge which has been generated in the first photoelectric conversion portion 101A is supplied to the column circuit 113, through the amplifier portion 201 and the output signal line 207. The first signal can be used for the focus detection.

Incidentally, in a time period between the time t8 and the time t9, the driving pulse PTXB is in the low level, and accordingly the second transfer transistor 104A is kept off. Specifically, in a first control operation in between the times t8 and t9, from a state in which both of the first and second transfer transistors 103A and 104A are turned off, the second transfer transistor 104A remains turned off, and the first transfer transistor 103A is turned on.

In the column circuit 113, a change of the voltage is multiplied by an inversion gain which has a ratio of a capacitance value C0 of the input capacitor 116 to a capacitance value Cf of the feedback capacitor 117, and the multiplied value is output. Specifically, when the change of the voltage in the output signal line 207 is represented by ΔVa (negative), an output voltage V(A) of the operational amplifier 119 is expressed by the following equation (1).

$$V(A)=Vref+\Delta Va \times (-C0/Cf) \quad (1)$$

Next, at the time t10, the driving pulse PTSA becomes a high level from a low level, and the switch 125 is turned on. Next, at the time t11, the driving pulse PTSA becomes the low level from the high level, and the switch 125 is turned off. By this operation, the output voltage V(A) of the operational amplifier 119 is held in the holding capacitor 121. The signal which is held in the holding capacitor 121 is a first signal for the focus detection, which is output from the first photoelectric conversion portion 101A.

Next, at the time t12, the driving pulse PTXA becomes a high level, and the driving pulse PTXB becomes the high level, at least in a part of a period during which the driving pulse PTXA is in the high level. Thereby, both of the first transfer transistor 103A and the second transfer transistor 104A are turned on. By this operation, the electric charges of both of the photoelectric conversion portions 101A and 102A can be simultaneously transferred to the FD portion 110. Incidentally, the driving pulse PTXA and the driving pulse PTXB may be simultaneous shifted to the high level from the low level. Alternatively, the driving pulse PTXA may be shifted to the high level from the low level prior to the driving pulse PTXB. Further alternatively, the driving pulse PTXA may be shifted to the high level from the low level after the driving pulse PTXB. Next, at the time t13, the driving pulses PTXA and PTXB become the low level, and the transfer transistors 103A and 104A are turned off. In a second control operation in between the time t12 and the time t13, from a state in which both of the first transfer transistor 103A and the second transfer transistor 104A are turned off, both of the first transfer transistor 103A and the second transfer transistor 104A are turned on.

Here, the high-level voltage of the driving pulse PTXA, which is applied to the transfer transistor 103A from the time t8 to the time t9, is lower than the high-level voltages of the driving pulses PTXA and PTXB, which are applied to the transfer transistors 103A and 104A, respectively, from the time t12 to the time t13. According to this configuration, three potentials shall be applied to the gate electrode of the transfer transistor 103A, which are the low-level voltage, the high-level voltage in the first control operation in between the time t8 and the time t9, and the high-level voltage in the second control operation in between the time t12 and the time t13.

When the above described three levels are compared in FIG. 4, the following points are clear. Specifically, a difference in a control voltage of the first control operation between the state in which the first transfer transistor 103A is turned on and the state in which the first transfer transistor 103A is turned off is smaller than a difference in a control voltage of the second control operation between the state in which the first transfer transistor 103A is turned on and the state in which the first transfer transistor 103A is turned off.

Firstly, the case will be described below where the first transfer transistor 103A is an n-channel field effect transistor. In the case, as is illustrated in FIG. 4, the gate voltage PTXA of the first control operation in between the time t8 and the time t9 in the state in which the first transfer transistor 103A is turned on is lower than the gate voltage PTXA of the second control operation in between the time t12 and the time t13 in the state in which the first transfer transistor 103A is turned on.

Next, the case will be described where the first transfer transistor 103A is a p-channel field effect transistor. In the case, the gate voltage of the first control operation in between the time t8 and the time t9 in the state in which the first transfer transistor 103A is turned on is higher than the gate voltage of the second control operation in between the time t12 and the time t13 in the state in which the first transfer transistor 103A is turned on.

By the operation from the time t12 to the time t13, a signal for image formation can be output to the output signal line 207. The signal for the image formation, which has been output to the output signal line 207, is supplied to the column circuit 113. The change of the voltage in the output signal line 207 shall be represented by ΔVa+b (negative). Then, the output voltage V(A+B) of the operational amplifier 119 is expressed by the following equation (2).

$$V(A+B)=Vref+(\Delta Va+b) \times (-C0/Cf) \quad (2)$$

Next, at the time t14, a driving pulse PTS(A+B) becomes a high level from a low level, and a switch 127 is turned on. Next, at the time t15, the driving pulse PTS(A+B) becomes the low level from the high level, and the switch 127 is turned off. By this operation, the voltage V(A+B) of the output node of the operational amplifier 119 is held by the holding capacitor 123. The signal which is held by the holding capacitor 123 is a signal for the image formation.

Next, at the time t16, the driving pulse PRES becomes the high level. Thereby, the reset transistor 202 is turned on, and the voltage of the FD portion 110 is reset.

Next, after the time t17, the switches 129 to 132 are sequentially turned on in synchronization with a pulse PH which the horizontal scanning circuit 114 outputs. Thereby, the signals which have been held in the holding capacitors 121 to 124 are sequentially read out to the horizontal output signal lines 139 and 140. Specifically, firstly, the signal of the holding capacitor 121 is read out to the horizontal output signal line 139, and the signal of the holding capacitor 122 is read out to the horizontal output signal line 140. After that, the signal of the holding capacitor 123 is read out to the horizontal output signal line 139, and the signal of the holding capacitor 124 is read out to the horizontal output signal line 140.

A signal for the image formation corresponding to one pixel 100A is obtained based on a difference in voltages between the voltage V(A+B) of the holding capacitor 123 and the voltage Vref of the holding capacitor 124, which is expressed by the following equation (3).

$$V(A+B)-V\text{ref}=\Delta Va+b \times (-C0/Cf) \quad (3)$$

In addition, a signal of only the first photoelectric conversion portion 101A can be obtained based on a difference in voltages between the voltage V(A) of the holding capacitor 121 and the voltage Vref of the holding capacitor 122, which is expressed by the following equation (4).

$$V(A)-V\text{ref}=\Delta Va \times (-C0/Cf) \quad (4)$$

Furthermore, a signal of only the second photoelectric conversion portion 102A can be obtained based on a difference in voltages between the voltage V(A) of the holding capacitor 121 and the voltage V(A+B) of the holding capacitor 123, which is expressed by the following equation (5).

$$V(A+B)-V(A)=(\Delta Va+b-\Delta Va) \times (-C0/Cf) \quad (5)$$

The above described computation can be performed in the imaging device, or can also be performed in a signal processing unit after the signals have been output from the imaging device. However, the signal of only the first photoelectric conversion portion 101A, and the signal after the addition of the two photoelectric conversion portions 101A and 102A are obtained in the imaging device.

According to the present embodiment, the imaging device has an output amplifier 115 which can perform difference processing in the rear stage of the horizontal output signal lines 139 and 140, and accordingly can output a difference between the signals which are held in the holding capacitors 121 and 122, to the outside of the imaging device. Furthermore, the imaging device can output a difference between the signals which are held in the holding capacitors 123 and 124, to the outside of the imaging device. Thereby, the present embodiment can reduce a noise which is generated in the horizontal output signal lines 139 and 140. Incidentally, the output amplifier 115 does not necessarily need to be configured so as to obtain a differential output, but may also be a simple buffer stage.

In the driving method illustrated in FIG. 4, the second control operation is performed in the state in which at least a part of the signal charges which have been transferred to the FD portion 110 by the first control operation has been held in the FD portion 110. Specifically, in a period after the electric charge of the photoelectric conversion portion 101A has been transferred to the FD portion 110 and before the electric charges of both of the photoelectric conversion portions 101A and 102A are concurrently transferred to the FD portion 110, the voltage of the FD portion 110, specifically, the voltage of the input node of the amplifier portion 201 is not reset. In other words, in a period after the first transfer transistor 103A has been turned on and before both of the first and second transfer transistors 103A and 104A are turned on, the reset transistor 202 is kept off.

As for a modified example, the reset transistor 202 may be turned on, for instance, in a period from the time t11 to the time t12. The reset transistor 202 can reset the voltage based on the electric charge of the FD portion 110, in a period between the first control operation in between the times t8 and t9 and the second control operation in between the times t12 and t13. In such a modified example, a first signal for the focus detection output from the first photoelectric conversion portion 101A and a second signal for the focus detection output from the second photoelectric conversion portion 102A are individually obtained. The signal for the image formation can be obtained by an operation of adding the two signals for the focus detection.

In the above description, the operation of the imaging device illustrated in FIG. 1 has been described. The operation of the imaging device illustrated in FIG. 2 is also similar to the read-out operation of the driving timing illustrated in FIG. 4. In the imaging device in FIG. 2, the signals output from the photoelectric conversion portions 101A and 102A and the signal output from the photoelectric conversion portions 101B and 102B can be read out as signals of different rows.

Specifically, in the first pixel 100A, after the signal of the photoelectric conversion portion 101A has been read out, the electric charges of the photoelectric conversion portions 101A and 102A are added in the FD portion 110. Thereby, both of the signals for the focus detection and the signal for imaging can be generated. Subsequently, in the second pixel 100B, after the signal of the photoelectric conversion portion 101B has been read out, the electric charges of the photoelectric conversion portions 101B and 102B are added in the FD portion 110. Thereby, both of the signals for the focus detection and the signal for imaging can be generated.

In the imaging device illustrated in FIG. 2, the two different pixels 100A and 100B share the amplifier portion 201. Accordingly, the electric charges of the photoelectric conversion portions 101A and 101B can be added in the FD portion 110, and the signals of the photoelectric conversion portions 102A and 102B can be also added in the FD portion 110.

Figure 5:
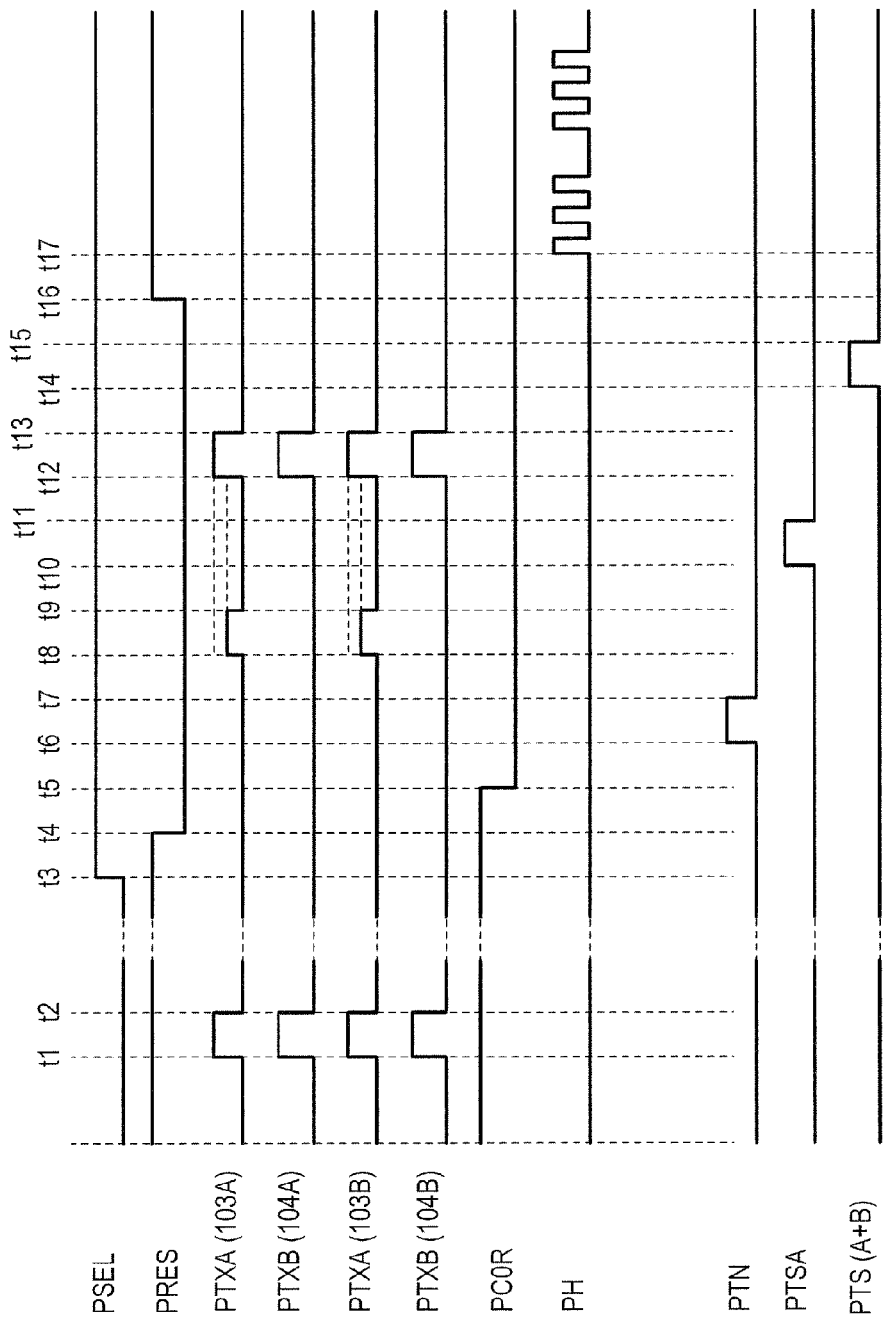
FIG. 5 is a view illustrating a driving timing of the imaging device.

The example of the driving timing in the case where the imaging device adds the signals of the two pixels 100A and 100B and reads out the result is illustrated in FIG. 5. Here, PTXA(103A) shall represent the driving pulse which is supplied to the transfer transistor 103A, and PTXB(104A) shall represent the driving pulse which is supplied to the transfer transistor 104A. Furthermore, PTXA(103B) shall represent the driving pulse which is supplied to the transfer transistor 103B, and PTXB(104B) shall represent the driving pulse which is supplied to the transfer transistor 104B. Hereafter, the points will be described in which FIG. 5 is different from FIG. 4.

At the time t8, the driving pulses PTXA(103A) and PTXA(103B) become high levels from low levels. After that, at the time t9, the driving pulses PTXA(103A) and PTXA(103B) become the low levels from the high levels. By this operation, the transfer transistors 103A and 103B are turned on, and the electric charges of the photoelectric conversion portions 101A and 101B which are contained in the different pixels 100A and 100B are added in the FD portion 110. This signal is used as a signal for focus detection.

At the time t12, the driving pulses PTXA(103A), PTXB(104A), PTXA(103B) and PTXB(104B) become high levels from low levels. After that, at the time t13, the driving pulses PTXA(103A), PTXB(104A), PTXA(103B) and PTXB(104B) become the low levels from the high levels. By this operation, the transfer transistors 103A, 104A, 103B and 104B are turned on, and all of the electric charges of the photoelectric conversion portions 101A, 102A, 101B and 102B which are contained in the different pixels 100A and 100B are added in the FD portion 110. This signal is used as a signal for imaging.

The high-level voltages of the driving pulses PTXA (103A) and PTXA(103B) between the time t8 and the time t9 are lower than the high-level voltages of the driving pulses PTXA(103A), PTXB(104A), PTXA(103B) and PTXB(104B) between the time t12 and the time t13.

By the above operation, the electric charges of the plurality of photoelectric conversion portions 101A and 101B are added which are contained in the different pixels 100A and 100B, and the signal for the focus detection is obtained. Because of this, the S/N can be enhanced. As a result, highly accurate focus detection is enabled.

Figure 6A:
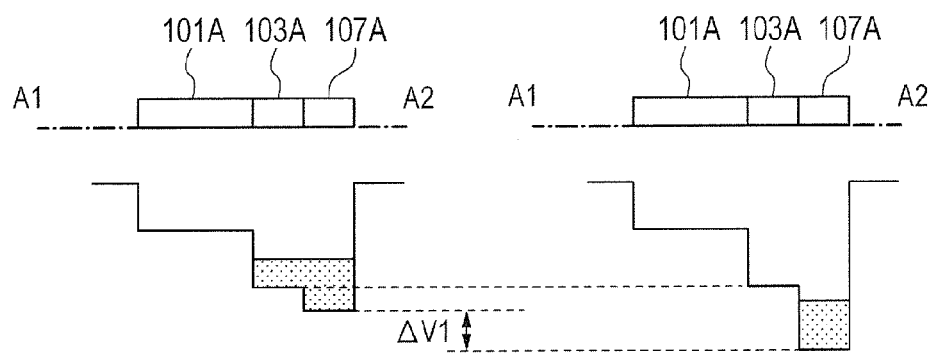
FIGS. 6A and 6B are views schematically illustrating potentials of an imaging device.
Figure 6B:
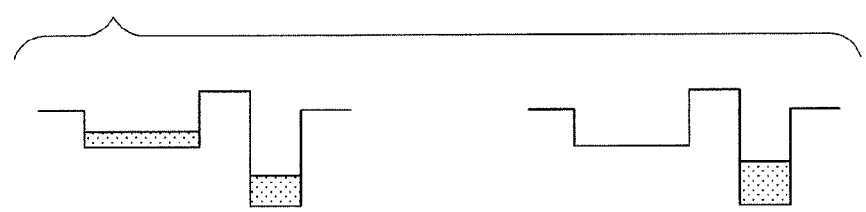
Figure 7A:
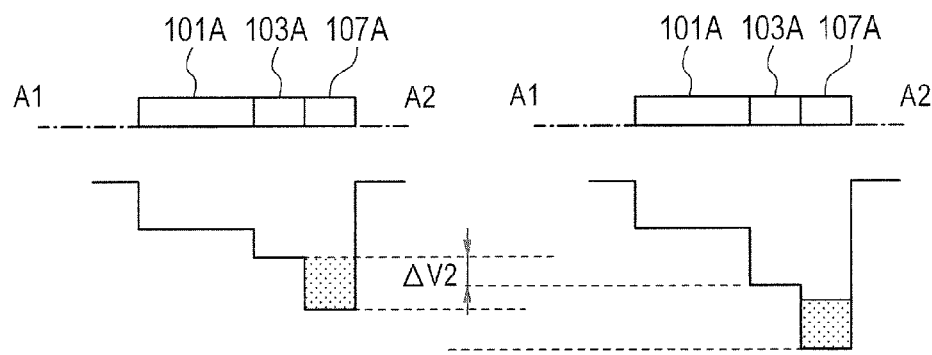
FIGS. 7A and 7B are views schematically illustrating potentials of the imaging device.
Figure 7B:
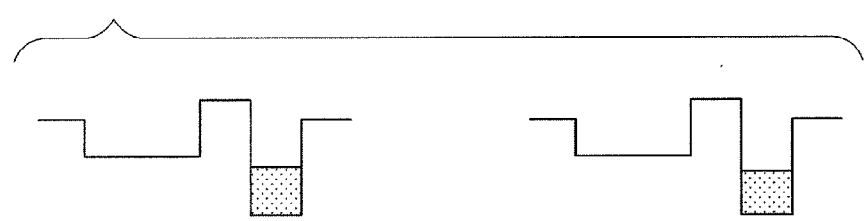

FIG. 6A, FIG. 6B, FIG. 7A and FIG. 7B schematically illustrate potentials in the pixel portion 100 in the imaging device. The vertical axis shows the height of the potential level for the signal charge. In the present embodiment, the signal charges are electrons, and accordingly the downward direction of the vertical axis shows a higher voltage. The horizontal axis shows the position in the semiconductor substrate. FIG. 6A and FIG. 6B illustrate the potentials of the case where the voltage that is applied to the first transfer transistor 103A in the first control operation is equal to the voltage that is applied to the gates of the first and second transfer transistors 103A and 104A in the second control operation, as comparative examples. FIG. 7A and FIG. 7B illustrate the potentials of the case of the present embodiment.

FIG. 6A illustrates the potentials at the time when the high-level driving pulse PTXA(103A) has been supplied to the gate electrode of the transfer transistor 103A. FIG. 6B illustrates the potentials at the time after the driving pulse PTXA which is supplied to the gate electrode of the transfer transistor 103A has changed to a low level from the high level.

The figures in the left side in FIG. 6A and FIG. 6B illustrate the potentials in the first control operation, in the cross-section along a line A1-A2 in FIG. 3. Specifically, the figures illustrate the potentials of the photoelectric conversion portion 101A, a semiconductor region existing under the gate electrode of the first transfer transistor 103A, and the FD region 107A. The figure in the left side in FIG. 6A illustrates a state in which the first transfer transistor 103A is turned on and the second transfer transistor 104A is turned off.

The figures in the right side in FIG. 6A and FIG. 6B illustrate the potentials in the second control operation, in the cross-section along the line A1-A2 in FIG. 3. Specifically, the figures illustrate the potentials of the photoelectric conversion portion 101A, the semiconductor region existing under the gate electrode of the first transfer transistor 103A, and the FD region 107A. The figure in the right side in FIG. 6A illustrates a state in which both of the first transfer transistor 103A and the second transfer transistor 104A are turned on.

Here, when the voltage of the gate of the transfer transistor 103A has changed to a high level from a low level, the potential of the FD portion 110 changes due to the capacitive coupling between the gate electrode of the transfer transistor 103A and the FD portion 110. In FIG. 6A, when the potential of the FD region 107A in the first control operation is compared to the potential of the FD region 107A in the second control operation, the potential of the FD region 107A in the first control operation is higher by ΔV1. This is because the capacitive coupling between the gate electrodes of the two transfer transistors 103A and 104A and the FD portion 110 is larger than the capacitive coupling between the gate electrode of the transfer transistor 103A and the FD portion 110. Specifically, in the case where both of the two transfer transistors 103A and 104A are turned on, the potential of the FD portion 110 is lowered, compared to the case where only the one transfer transistor 103A is turned on.

As for a difference between the potential of the FD region 107A and the potential of the transfer transistor 103A, when the gate voltage of the transfer transistor 103A is in the high level, the case of the first control operation is smaller than the case of the second control operation. Specifically, the amount of the electric charges which can be held by the FD region 107A when the gate voltage of the transfer transistor 103A is in the high level is smaller in the case of the first control operation, and accordingly the electric charges come to easily exist also in the region of the transfer transistor 103A, as in the left side in FIG. 6A. In this case, when a voltage of the gate electrode of the transfer transistor 103A in the first control operation changes to a low level from a high level, the electric charges occasionally return to the region of the photoelectric conversion portion 101A, as in the left side in FIG. 6B.

In the case of the second control operation, the capacitive coupling between the gate electrode of the transfer transistor 103A and the FD portion 110 becomes larger than that in the case of the first control operation, and accordingly such a possibility that the electric charges return to the photoelectric conversion portion 101A becomes lower than that in the case of the first control operation.

On the other hand, in the present embodiment, as is illustrated in FIG. 7A, the high level of the gate voltage of the transfer transistor 103A in the first control operation is lower by ΔV2 than the high level of the gate voltage of the transfer transistor 103A in the second control operation. Because of this, also in the first control operation, the difference between the potential of the FD region 107A and the potential of the transfer transistor 103A can be enlarged. As is illustrated in FIG. 7B, not only in the second control operation but also in the first control operation, the amount of the electric charges which return to the photoelectric conversion portion 101A when the gate voltage of the transfer transistor 103A changes to the low level from the high level can be reduced or controlled to zero.

Incidentally, ΔV2 is a difference between the high level of the gate voltage of the transfer transistor 103A in the first control operation and the high level of the gate voltage of the transfer transistor 103A in the second control operation. The high level of the gate voltage of the transfer transistor 103A in the first control operation is set so that ΔV2 becomes close or equal to the difference ΔV1 between the potentials of the FD regions 107A illustrated in FIG. 6A. Thereby, the amounts of the electric charges which can be held in the FD region 107A in the first control operation and the second control operation can be equalized, and highly accurate focus detection is enabled.

As has been described above, the pixel 100A which is included in the imaging device includes the first photoelectric conversion portion 101A, the second photoelectric conversion portion 102A, the first transfer transistor 103A, the second transfer transistor 104A and the charge holding portion. Here, the charge holding portion includes the FD portion 110 which is electrically connected to the input node of the amplifier portion 201. The first transfer transistor 103A transfers an electric charge which has been generated in the first photoelectric conversion portion 101A, to the FD portion 110. The second transfer transistor 104A transfers an electric charge which has been generated in the second photoelectric conversion portion 102A, to the FD portion 110. Incidentally, in FIG. 3, the first photoelectric conversion portion 101A, the second photoelectric conversion portion 102A, the gate electrode of the first transfer transistor 103A and the gate electrode of the second transfer transistor 104A are illustrated. In FIG. 3, the FD regions 107A and 108A which constitute the FD portion 110, and the electroconductive member 109A which electrically connects the FD regions to each other are also illustrated.

In such a configuration, firstly, the electric charge of the first photoelectric conversion portion 101A is transferred to the FD portion 110. After that, both of the two transfer transistors 103A and 104A are turned on, which correspond to the first and second photoelectric conversion portions 101A and 102A, respectively. Incidentally, turning on both of the two transfer transistors 103A and 104A means making a period exist during which both of the two transfer transistors 103A and 104A are turned on. The timings at which the two transfer transistors 103A and 104A are shifted to the turned-on state from the turned-off state may not necessarily need to be the same time. The timings at which the two transfer transistors 103A and 104A are shifted to the turned-off state from the turned-on state may not necessarily need to be the same time. Similarly, turning off both of the two transfer transistors 103A and 104A means making a period exist during which both of the two transfer transistors 103A and 104A are turned off.

Specifically, the imaging device has a control unit 112 which controls the transfer transistors 103A and 104A to the turned-on state or the turned-off state. The control unit 112 performs the first control operation of converting the first transfer transistor 103A into the turned-on state in a state of having kept the second transfer transistor 104 off, from the state in which both of the first and second transfer transistors 103A and 104A are turned off. Thereby, the electric charge which has been generated in the first photoelectric conversion portion 101A is transferred to the FD portion 110. After that, the control unit 112 performs the second control operation of converting both of the first and second transfer transistors 103A and 104A into the turned-on state.

The control units 112, 114 and the like are configured with a circuit such as a shift register and a decoder, for instance. In this case, the control operation means that the control unit outputs a driving pulse which converts each of the transfer transistors 103A and 104A into the turned-on state or the turned-off state. In addition to the circuits, various circuits which can control the transfer transistors 103A and 104A are used for the control unit.

In the present embodiment, the voltage which is applied to the gate of the first transfer transistor 103A when the first control operation is performed is lower than the voltage which is applied to the gates of the first and second transfer transistors 103A and 104A when the second control operation is performed. The second control operation in between the time t12 and the time t13 may be performed in a state in which at least a part of the electric charges that have been transferred by the first control operation in between the time t8 and the time t9 is held by the FD portion 110. Due to such a control, the first signal based on one electric charge of the two photoelectric conversion portions 101A and 102A can be read out, and after that, an added signal based on the total of the electric charges of the two photoelectric conversion portions 101A and 102A can be readout. In addition, the second signal based on the electric charge of the other photoelectric conversion portion can be obtained by performing differential processing between the first signal which has been previously read out and the added signal.

Incidentally, the reset transistor 202 can also reset the voltage of the FD portion 110 in a period between the first control operation and the second control operation. Due to such a control, the imaging device can read out each independently the first signal based on the electric charge of one photoelectric conversion portion and the second signal based on the electric charge of the other photoelectric conversion portion.

The effects of the present embodiment which has been described above will be described below. Under a low illumination condition, the voltage which is applied to the gate of the first transfer transistor 103A when the first control operation is performed is lower than the voltage which is applied to the gates of the first and second transfer transistors 103A and 104A when the second control operation is performed. In this case, the electric charges which return to the photoelectric conversion portion 101A when the transfer transistor 104A is turned off in the first control operation can be reduced or controlled to zero.

Second Embodiment

Figure 8:
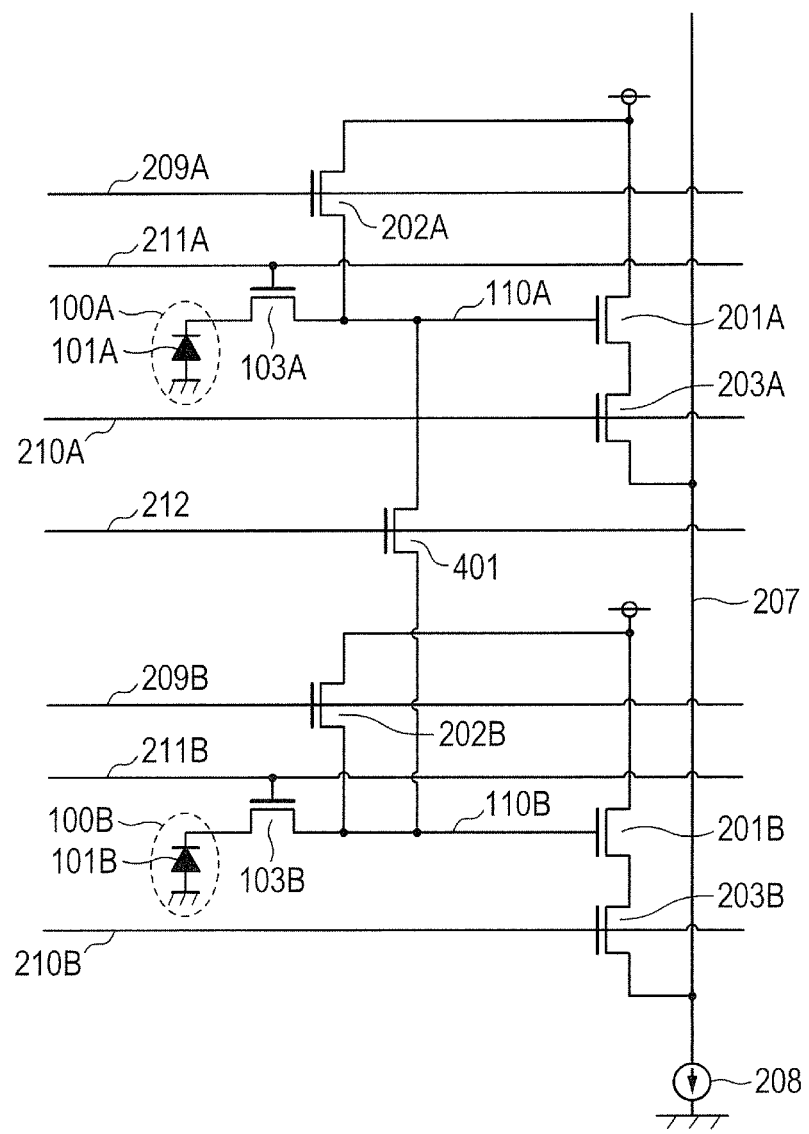
FIG. 8 is a view illustrating an equivalent circuit of an imaging device.

FIG. 8 is a circuit diagram illustrating a configuration example of a pixel portion 100 in an imaging device according to a second embodiment of the present invention. In FIG. 1, the plurality of photoelectric conversion portions 101A and 102A constitute the pixel 100A, but in FIG. 8, one photoelectric conversion portion 101A constitutes the pixel 100A. Hereafter, the points will be described in which the present embodiment is different from the first embodiment.

The first pixel 100A has the first photoelectric conversion portion 101A which converts light into an electric charge. A first FD portion 110A is a first charge holding portion which holds an electric charge. A first transfer transistor 103A is connected between the first photoelectric conversion portion 101A and the first FD portion 110A, and transfers the electric charge of the first photoelectric conversion portion 101A to the first FD portion 110A. A driving signal line 211A is connected to a gate of the first transfer transistor 103A. A first reset transistor 202A is connected to the first FD portion 110A. A driving signal line 209A is connected to a gate of the first reset transistor 202A. The first FD portion 110A is connected to a gate of a first amplifier portion 201A. The first amplifier portion 201A outputs a signal based on the electric charge of the first FD portion 110A. A first select transistor 203A is connected between the first amplifier portion 201A and the output signal line 207. A driving signal line 210A is connected to a gate of the first select transistor 203A.

The second pixel 100B has a second photoelectric conversion portion 101B which converts light into an electric charge. A second FD portion 110B is a second charge holding portion which holds an electric charge. A second transfer transistor 103B is connected between the second photoelectric conversion portion 101B and the second FD portion 110B, and transfers the electric charge of the second photoelectric conversion portion 101B to the second FD portion 110B. A driving signal line 211B is connected to a gate of the second transfer transistor 103B. A second reset transistor 202B is connected to the second FD portion 110B. A driving signal line 209B is connected to a gate of the second reset transistor 202B. The second FD portion 110B is connected to a gate of a second amplifier portion 201B. The second amplifier portion 201B outputs a signal based on the electric charge of the second FD portion 110B. A second select transistor 203B is connected between the second amplifier portion 201B and the output signal line 207. A driving signal line 210B is connected to a gate of the second select transistor 203B.

An addition transistor 401 electrically connects the FD portions 110A and 110B to each other. In FIG. 8, portions having similar functions to those in FIG. 1 are designated by the same reference numeral. Different alphabets are attached subsequently to the reference numerals, and thereby corresponding elements are illustrated.

An imaging device includes the first pixel 100A which includes the photoelectric conversion portion 101A, and the second pixel 100B which includes the photoelectric conversion portion 101B. Light which has been condensed by a first microlens is incident on the photoelectric conversion portion 101A which is contained in the first pixel 100A. Light which has been condensed by a second microlens is incident on the photoelectric conversion portion 101B which is contained in the second pixel 100B.

Transfer transistors 103A and 103B are arranged so as to correspond to the photoelectric conversion portions 101A and 101B, respectively. Driving signal lines 211A and 211B are arranged as interconnections which supply driving pulses to the transfer transistors 103A and 103B, respectively. The addition transistor 401 is arranged which electrically connects the FD portions 110A and 110B to each other. A driving signal line 212 is arranged as a interconnection which supplies a driving pulse to the addition transistor 401. The pixels 100A and 100B may be adjacent to each other, but may not need to be adjacent to each other.

According to such a configuration, by using the addition transistor 401, the imaging device can add the electric charges of the plurality of photoelectric conversion portions 101A and 101B which are contained in the different pixels 100A and 100B, respectively, and obtain the result. Because of this, the S/N can be enhanced.

In the imaging device illustrated in FIG. 8, the case where the FD portions 110A and 110B are electrically connected to each other with the use of the addition transistor 401 shall be referred to as an addition mode, and the case where the FD portions 110A and 110B are not electrically connected to each other shall be referred to as a non-addition mode. In the addition mode, the addition transistor 401 is in the on state and in the non-addition mode, the addition transistor 401 is in the off state.

In the addition mode, both of the first transfer transistor 103A and the second transfer transistor 103B are turned on. In the addition mode, the signal of the photoelectric conversion portion 101A is read out in the first pixel 100A, the signal of the photoelectric conversion portion 101B is read out in the second pixel 100B, and the addition transistor 401 is turned on, to thereby add the signals of the photoelectric conversion portions 101A and 101B.

In the non-addition mode, the addition transistor 401 is turned off, and the signal output from the photoelectric conversion portion 101A and the signal sent from the photoelectric conversion portion 101B can be read out as signals in different rows, respectively.

Incidentally, in the driving of the addition mode, the gate voltage of the transfer transistor 103B is controlled to be a high-level period, at least in a part of a period out of a high-level period of the gate voltage of the transfer transistor 103A. Thereby, both of the transfer transistor 103A and the transfer transistor 103B become a turned-on state.

Here, the high-level voltage which is applied to the gate electrodes of the transfer transistors 103A and 103B in the non-addition mode is controlled to be lower than the high-level voltage which is applied to the gate electrodes of the transfer transistors 103A and 103B in the addition mode. Thereby, three potentials shall be applied to the gate electrodes of the transfer transistor 103A and 103B, which are a low-level potential, a high-level potential in the non-addition mode, and a high-level potential in the addition mode.

A difference in a control voltage between the state in which the first transfer transistor 103A is turned on and the state in which the first transfer transistor 103A is turned off in the non-addition mode is smaller than a difference in a control voltage between the state in which the first transfer transistor 103A is turned on and the state in which the first transfer transistor 103A is turned off in the addition mode. The difference in the control voltage between the state in which the first transfer transistor 103A is turned on and the state in which the first transfer transistor 103A is turned off in the non-addition mode is smaller than a difference in a control voltage between the state in which the second transfer transistor 103B is turned on and the state in which the second transfer transistor 103B is turned off in the addition mode.

In addition, a difference in a control voltage between the state in which the second transfer transistor 103B is turned on and the state in which the second transfer transistor 103B is turned off in the non-addition mode is smaller than a difference in a control voltage between the state in which the first transfer transistor 103A is turned on and the state in which the first transfer transistor 103A is turned off in the addition mode. The difference in the control voltage between the state in which the second transfer transistor 103B is turned on and the state in which the second transfer transistor 103B is turned off in the non-addition mode is smaller than the difference in the control voltage between the state in which the second transfer transistor 103B is turned on and the state in which the second transfer transistor 103B is turned off in the addition mode.

Due to such a configuration, in the non-addition mode, the potentials become the potentials illustrated in the left side in FIG. 7A and FIG. 7B, and in the addition mode, the potentials become the potentials illustrated in the right side in FIG. 7A and FIG. 7B. When the gate voltages of the transfer transistors 103A and 103B change to low levels from high levels, the amount of the electric charges which return to the photoelectric conversion portions 101A and 101B can be reduced or controlled to zero.

Third Embodiment

Figure 9:
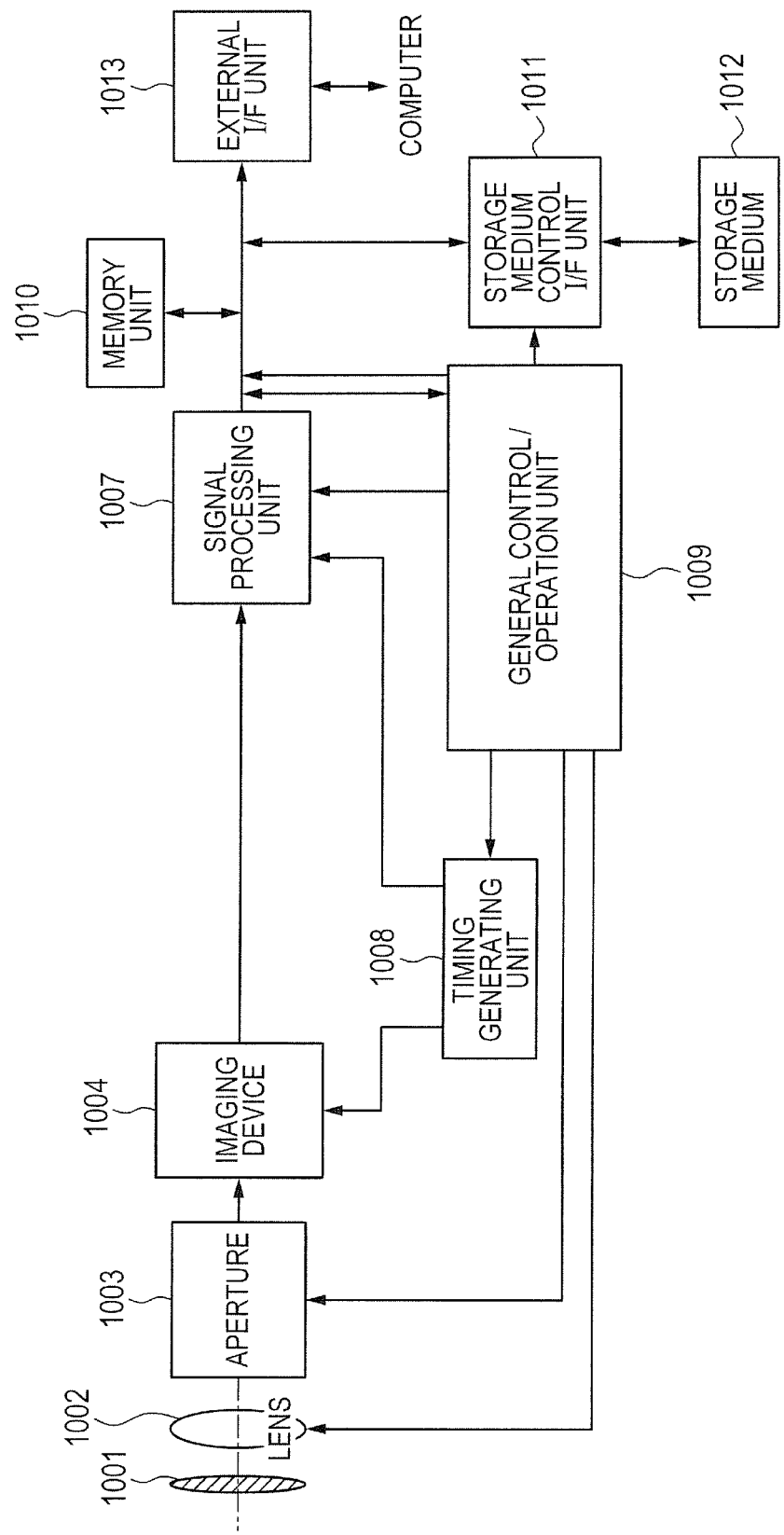
FIG. 9 is a block diagram of an imaging system.

FIG. 9 is a view illustrating a configuration example of an imaging system according to a third embodiment of the present invention. Examples of the imaging system include a digital still camera, a digital camcorder, a copying machine, a facsimile, a mobile phone, an in-vehicle camera and an observation satellite. FIG. 9 illustrates a configuration of the digital still camera as an example of the imaging system.

A barrier 1001 protects a lens 1002, the lens 1002 images an optical image of an object on an imaging device 1004 therethrough, and an aperture 1003 varies the amount of light which has passed through the lens 1002. The imaging device 1004 which has been described in each of the above described embodiments converts the optical image that has been imaged by the lens 1002, into image data. Here, an analog-to-digital conversion unit shall be formed on a semiconductor substrate of the imaging device 1004. A signal processing unit 1007 variously corrects the imaged data which has been output by the imaging device 1004, and compresses data. The signal processing unit 1007 processes the signal output from the imaging device 1004. A timing generating unit 1008 outputs various timing signals to the imaging device 1004 and the signal processing unit 1007, and a general control/operation unit 1009 controls the whole digital still camera. A frame memory unit 1010 temporarily stores image data, an interface unit 1011 records or reads out data onto a storage medium, and the storage medium 1012 such as a semiconductor memory is removable and records or reads out the imaged data. An interface unit 1013 communicates with an external computer and the like. Here, the timing signal and the like may be input from the outside of the imaging system. The imaging system may have at least the imaging device 1004, and the signal processing unit 1007 which processes the imaging signal that has been output from the imaging device 1004.

The imaging device 1004 and the analog-to-digital conversion unit may be provided each on different semiconductor substrates, or may also be formed on the same semiconductor substrate. Otherwise, the imaging device 1004 and the signal processing unit 1007 may be formed on the same semiconductor substrate.

In addition, the signal processing unit 1007 may be configured so as to process the signal based on the electric charge which has been generated by the first photoelectric conversion portion 101A and the signal based on the electric charge which has been generated by the second photoelectric conversion portion 102A, and to acquire information on a distance between the imaging device 1004 and the object.

In the embodiment of the imaging system, the imaging device in the first or the second embodiment is used for the imaging device 1004. Thus, in the imaging system, the first or second embodiment is applied, and thereby the noise can be reduced.

Incidentally, the present invention is not limited only to the above described embodiments. A modified example in which a part of the configurations of the above described embodiments has been changed in such a range as not to deviate from the scope of the invention is also the embodiment of the present invention. In addition, an example in which a part of the configurations of the above described embodiments has been added to another embodiment, or an example in which a part of the configurations of the above described embodiments is replaced with a part of the configuration of another embodiment is also the embodiment of the present invention.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-209293, filed Oct. 10, 2014, which is hereby incorporated by reference herein in its entirety.

What is claimed is:

1. An imaging device comprising:
   a first photoelectric conversion portion which converts light into an electric charge;
   a second photoelectric conversion portion which converts light into an electric charge;
   a charge holding portion which holds an electric charge;
   a first transfer transistor which transfers an electric charge of the first photoelectric conversion portion to the charge holding portion;
   a second transfer transistor which transfers an electric charge of the second photoelectric conversion portion to the charge holding portion; and
   an amplifier portion which outputs a signal based on an electric charge of the charge holding portion, wherein
   in a first control operation, from a state in which both of the first transfer transistor and the second transfer transistor are off, the first transfer transistor is turned on while the second transfer transistor remains off,
   in a second control operation, both of the first transfer transistor and the second transfer transistor are being on, and
   a difference between a control voltage provided in the first control operation to the first transfer transistor to turn on the first transfer transistor and a control voltage provided to the first transfer transistor to turn off the first transfer transistor is smaller than a difference between a control voltage provided in the second control operation to the first transfer transistor to turn on the first transfer transistor and the control voltage provided to the first transfer transistor to turn off the first transfer transistor.

2. The imaging device according to claim 1, wherein the second control operation is performed in a state in which at least a part of electric charges transferred by the first control operation are held in the charge holding portion.

3. The imaging device according to claim 1, further comprising:
   a reset transistor which resets a voltage of the charge holding portion in a period between the first control operation and the second control operation.

4. The imaging device according to claim 1, wherein in the second control operation, both of the first transfer transistor and the second transfer transistor are turned on, from the state in which both of the first transfer transistor and the second transfer transistor are off.

5. The imaging device according to claim 1, wherein the charge holding portion includes a floating diffusion portion electrically connected to an input node of the amplifier portion.

6. The imaging device according to claim 1, wherein the charge holding portion includes a floating diffusion region which holds an electric charge, and
   the imaging device further comprises a conductive member which electrically connects the floating diffusion region and the amplifier portion.

7. The imaging device according to claim 6, wherein the floating diffusion region includes a first floating diffusion region to which the electric charge of the first photoelectric conversion portion is transferred, and a second floating diffusion region to which the electric charge of the second photoelectric conversion portion is transferred, and
   the conductive member electrically connects the first floating diffusion region and the second floating diffusion region to each other.

8. The imaging device according to claim 1, wherein the first transfer transistor is an n-channel type field effect transistor, and
   a gate voltage provided in the first control operation to turn on the first transfer transistor is lower than a gate voltage provided in the second control operation to turn on the first transfer transistor.

9. The imaging device according to claim 1, wherein the first transfer transistor is a p-channel type field effect transistor, and
   a gate voltage provided in the first control operation to turn on the first transfer transistor is higher than a gate voltage provided in the second control operation to turn on the first transfer transistor.

10. An imaging device comprising:
a first photoelectric conversion portion which converts light into an electric charge;
a second photoelectric conversion portion which converts light into an electric charge;
a first charge holding portion which holds an electric charge;
a second charge holding portion which holds an electric charge;
a first transfer transistor which transfers an electric charge of the first photoelectric conversion portion to the first charge holding portion;
a second transfer transistor which transfers an electric charge of the second photoelectric conversion portion to the second charge holding portion;
a first amplifier portion which outputs a signal based on an electric charge of the first charge holding portion;
a second amplifier portion which outputs a signal based on an electric charge of the second charge holding portion; and
an addition transistor for electrically connecting the first charge holding portion and the second charge holding portion, wherein
in a state in which the addition transistor is turned on, both of the first transfer transistor and the second transfer transistor are being on,
a difference between a control voltage provided, in a state in which the addition transistor is being off, to the first transfer transistor to turn on the first transfer transistor and a control voltage provided to the first transfer transistor to turn off the first transfer transistor is smaller than a difference between a control voltage provided, in a state in which the addition transistor is being on, to the first transfer transistor to turn on the first transfer transistor and the control voltage provided to the first transfer transistor to turn off the first transfer transistor, and is smaller than a difference between a control voltage provided, in a state in which the addition transistor is being on, to the second transfer transistor to turn on the second transfer transistor and a control voltage provided to the second transfer transistor to turn off the second transfer transistor, and
a difference between a control voltage provided, in a state in which the addition transistor is turned off, to the second transfer transistor to turn on the second transfer transistor and a control voltage provided to the second transfer transistor to turn off the second transfer transistor is smaller than the difference between the control voltage provided, in a state in which the addition transistor is being on, to the first transfer transistor to turn on the first transfer transistor and the control voltage provided to the first transfer transistor to turn off the first transfer transistor, and is smaller than the difference between the control voltage provided, in a state in which the addition transistor is being on, to the second transfer transistor to turn on the second transfer transistor and the control voltage provided to the second transfer transistor to turn off the second transfer transistor.

11. An imaging system comprising:
an imaging device including
a first photoelectric conversion portion which converts light into an electric charge;
a second photoelectric conversion portion which converts light into an electric charge;
a charge holding portion which holds an electric charge;
a first transfer transistor which transfers an electric charge of the first photoelectric conversion portion to the charge holding portion;
a second transfer transistor which transfers an electric charge of the second photoelectric conversion portion to the charge holding portion; and
an amplifier portion which outputs a signal based on an electric charge of the charge holding portion, wherein
in a first control operation, from a state in which both of the first transfer transistor and the second transfer transistor are off, the first transfer transistor is turned on while the second transfer transistor remains off;
in a second control operation, both of the first transfer transistor and the second transfer transistor are being on; and
a difference between a control voltage provided in the first control operation to the first transfer transistor to turn on the first transfer transistor and a control voltage provided to the first transfer transistor to turn off the first transfer transistor is smaller than a difference between a control voltage provided in the second control operation to the first transfer transistor to turn on the first transfer transistor and the control voltage provided to the first transfer transistor to turn off the first transfer transistor; and
a signal processing unit which processes a signal output from the imaging device.

* * * * *